(12) United States Patent
Asakawa

(10) Patent No.: US 8,008,182 B2
(45) Date of Patent: Aug. 30, 2011

(54) SEMICONDUCTOR DEVICE AND METHOD FOR MANUFACTURING SEMICONDUCTOR DEVICE

(75) Inventor: Tatsuhiko Asakawa, Fujimi (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 12/686,575

(22) Filed: Jan. 13, 2010

(65) Prior Publication Data

US 2010/0201001 A1 Aug. 12, 2010

(30) Foreign Application Priority Data

Feb. 9, 2009 (JP) ................................ 2009-027065

(51) Int. Cl.
*H01L 21/44* (2006.01)
(52) U.S. Cl. ............... 438/613; 438/614; 257/E21.503; 257/E21.51; 257/E21.511; 257/776
(58) Field of Classification Search .......... 438/117, 438/613, 614; 257/E21.503, E21.51, E21.511
See application file for complete search history.

(56) References Cited

U.S. PATENT DOCUMENTS

| | | | | | |
|---|---|---|---|---|---|
| 5,261,158 | A | * | 11/1993 | Schreiber et al. | ............... 29/848 |
| 7,122,896 | B2 | * | 10/2006 | Saito et al. | ............... 257/738 |
| 7,161,245 | B2 | * | 1/2007 | Saito | ............... 257/737 |
| 7,524,700 | B2 | | 4/2009 | Tanaka | |
| 7,534,652 | B2 | * | 5/2009 | Haba et al. | ............... 438/108 |
| 7,750,468 | B2 | * | 7/2010 | Asakawa | ............... 257/737 |
| 7,790,595 | B2 | * | 9/2010 | Asakawa et al. | ............... 438/613 |
| 7,830,007 | B2 | * | 11/2010 | Tanaka et al. | ............... 257/738 |
| 2005/0194686 | A1 | * | 9/2005 | Iwazaki et al. | ............... 257/738 |
| 2006/0286790 | A1 | * | 12/2006 | Yamasaki et al. | ............... 438/612 |
| 2006/0288572 | A1 | * | 12/2006 | Tanaka et al. | ............... 29/846 |
| 2007/0001200 | A1 | * | 1/2007 | Imai et al. | ............... 257/288 |
| 2007/0029652 | A1 | * | 2/2007 | Asakawa et al. | ............... 257/667 |
| 2007/0057371 | A1 | * | 3/2007 | Hashimoto | ............... 257/738 |
| 2008/0197486 | A1 | * | 8/2008 | Asakawa | ............... 257/734 |

FOREIGN PATENT DOCUMENTS

JP 2006-303420 11/2006
JP 2007-258518 10/2007

* cited by examiner

*Primary Examiner* — Alexander G Ghyka
*Assistant Examiner* — Leonard Chang
(74) *Attorney, Agent, or Firm* — Harness, Dickey & Pierce, P.L.C.

(57) ABSTRACT

A method for manufacturing a semiconductor device includes: a) preparing a structure including a semiconductor substrate, an electrode provided on a first surface of the semiconductor substrate, and an insulation film provided on the first surface and having an opening positioned on a first part of the electrode; b) forming a first metal layer from an upper surface of the first part of the electrode to an upper surface of the insulation film; c) forming a resin layer on a first part of the first metal layer, which is positioned on the first part of the electrode, and on the insulation film after the step b); d) removing at least a second part of the resin layer, which is positioned on the first part of the first metal layer, in a manner to leave a first part of the resin layer so as to form a resin protrusion; and e) forming a second metal layer, which is electrically connected with the electrode, from an upper surface of the first metal layer to an upper surface of the resin protrusion.

7 Claims, 10 Drawing Sheets

SEMICONDUCTOR DEVICE AND METHOD FOR MANUFACTURING SEMICONDUCTOR DEVICE

The entire disclosure of Japanese Patent Application No. 2009-027065, filed Feb. 9, 2009 is expressly incorporated by reference herein.

BACKGROUND

1. Technical Field

The present invention relates to a semiconductor device and a method for manufacturing the same.

2. Related Art

It is known that a terminal having elasticity is formed on a semiconductor device by forming a resin protrusion and forming a plurality of wirings on the protrusion, as disclosed in JP-A-2006-303420. In a process for manufacturing a resin protrusion, an electrode made of aluminum or copper, for example, is formed; then a resin layer is formed in a region including a surface on which the electrode is exposed; and an exposure treatment and a developing treatment are performed on the resin layer. Thus, a resin protrusion having a desired shape can be obtained. However, strongly-alkaline developer used in the step of performing the developing treatment has strong corrosivity with respect to aluminum and the like, so as to damage the surface on which the electrode is exposed. When the electrode which is damaged is coupled with a wiring containing gold, for example, the damaged electrode causes diffusion of aluminum and gold, degrading connecting reliability between the electrode and the wiring. Therefore, in the manufacturing process, it is desired to prevent an organic alkaline developer from damaging the electrode and thus improve the connecting reliability between the wiring and the electrode of the semiconductor device.

SUMMARY

An advantage of the present invention is to provide a semiconductor device having high connecting reliability between an electrode and a wiring.

Another advantage of the present invention is to provide a method for manufacturing a semiconductor device having high connecting reliability between an electrode and a wiring.

A method for manufacturing a semiconductor device, according to a first aspect of the invention, includes: a) preparing a structure including a semiconductor substrate, an electrode provided on a first surface of the semiconductor substrate, and an insulation film provided on the first surface and having an opening positioned on a first part of the electrode; b) forming a first metal layer from an upper surface of the first part of the electrode to an upper surface of the insulation film; c) forming a resin layer on a first part of the first metal layer, which is positioned on the first part of the electrode, and on the insulation film after the step b); d) removing at least a second part of the resin layer, which is positioned on the first part of the first metal layer, in a manner to leave a first part of the resin layer so as to form a resin protrusion; and e) forming a second metal layer, which is electrically connected with the electrode, from an upper surface of the first metal layer to an upper surface of the resin protrusion.

According to the first aspect, a method for manufacturing a semiconductor device by which a semiconductor device having high connecting reliability between an electrode and a wiring can be manufactured can be provided.

The method of the first aspect further includes: f) forming a third metal layer on the insulation film separately from the first metal layer before the step c). In the method, the resin protrusion may be formed between the first metal layer and the third metal layer in the step d).

The method of the first aspect further includes: g) forming a fourth metal layer on the insulation film before the step c). In the method, the fourth metal layer may be disposed between the first metal layer and the third metal layer, and the resin protrusion may be formed on the fourth metal layer in the step d).

In the method of the first aspect, the resin protrusion may be formed on a third part of the first metal layer, which is positioned between the first part of the first metal layer and a second part of the first metal layer, in the step d).

In the method of the first aspect, the electrode may contain aluminum.

In the method of the first aspect, the first metal layer may contain titanium-tungsten.

In the method of the first aspect, the step d) may include developing the resin layer with an alkaline developer.

A semiconductor device according to a second aspect of the invention includes: a semiconductor substrate provided with an integrated circuit and having a first surface; an electrode formed on the first surface of the semiconductor substrate and electrically connected with the integrated circuit; an insulation film formed on the semiconductor substrate and having an opening at a part thereof on a first part of the electrode; a first metal layer formed from an upper surface of the electrode to an upper surface of the insulation film in a manner to be electrically connected with the electrode so as to cover at least the opening; a resin protrusion formed adjacent to the first metal layer; and a second metal layer formed from an upper surface of the first metal layer to an upper surface of the resin protrusion.

According to the second aspect, a semiconductor device having high connecting reliability between an electrode and a wiring can be provided.

The semiconductor device of the second aspect further includes a third metal layer formed on the insulation film separately from the first metal layer. In the device, the resin protrusion may be formed between the first metal layer and the third metal layer.

The semiconductor device of the second aspect further includes a fourth metal layer formed on the insulation film. In the device, the fourth metal layer may be positioned between the first metal layer and the third metal layer, and the resin protrusion may be formed on the fourth metal layer.

In the semiconductor device of the second aspect, the resin protrusion may be formed on a third part of the first metal layer which is positioned between a first part of the first metal layer and a second part of the first metal layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments according to the invention will be described below with reference to the accompanying drawings. Note that the invention is not limited to the following embodiments. The present invention includes any combinations of the following embodiments and modifications.

1. First Embodiment

1-1 Semiconductor Device

A semiconductor device according to a first embodiment will now be described with reference to the accompanying drawings.

Figure 1A:
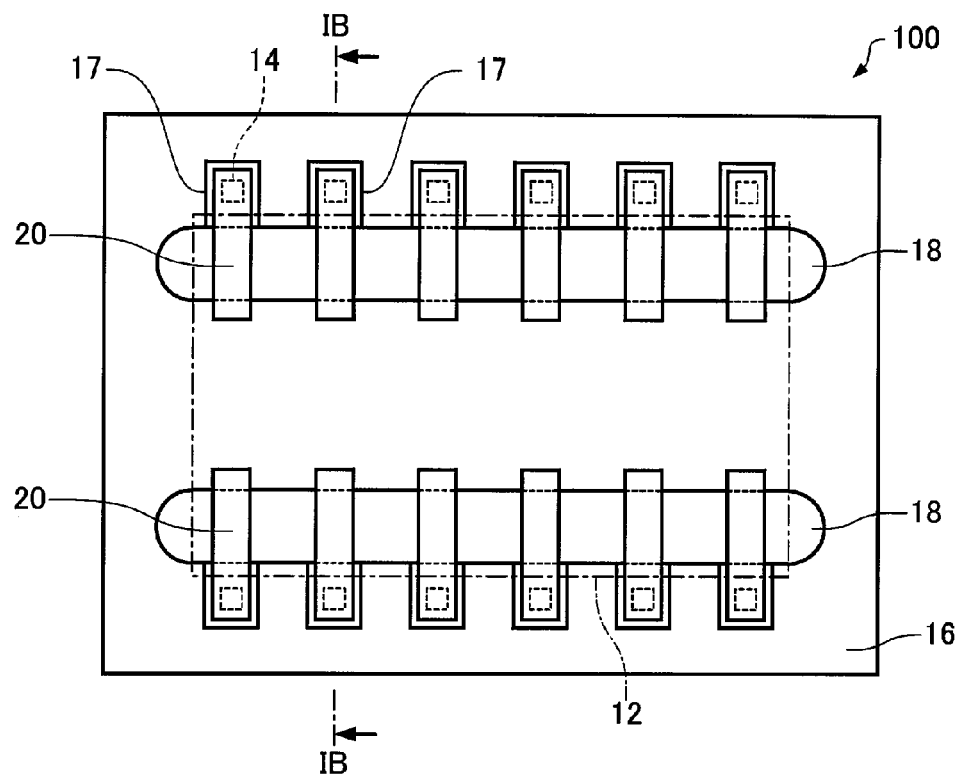
FIG. 1A is a plan view schematically showing a semiconductor device 100 according to a first embodiment.
Figure 1B:
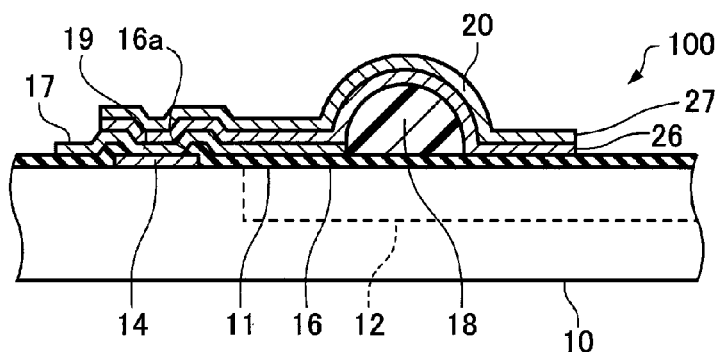
FIG. 1B is a sectional view schematically showing a main part of a section taken along an IB-IB line of the semiconductor device 100 shown in FIG. 1A.

FIG. 1A is a plan view schematically showing a semiconductor device 100 according to the first embodiment. FIG. 1B is a sectional view schematically showing a main part of a section taken along an IB-IB line of the semiconductor device 100 shown in FIG. 1A.

Referring to FIG. 1A, the semiconductor device 100 of the first embodiment includes: a semiconductor substrate 10; an electrode 14; an insulation film 16; a first metal layer 17; a resin protrusion 18; and a second metal layer 20. The semiconductor substrate 10 is provided with an integrated circuit 12 and has a first surface 11. The electrode 14 is formed on the first surface 11 of the semiconductor substrate 10 and is electrically connected with the integrated circuit 12. The insulation layer 16 is formed on the first surface 11 of the semiconductor substrate 10 and has an opening 16a at a part thereof on the electrode 14. The first metal layer 17 is formed from an upper surface of the electrode 14 (or a surface, which is an opposite surface to a surface facing the semiconductor substrate 10, of the electrode 14) to an upper surface of the insulation film 16 (or a surface, which is an opposite surface to a surface facing the semiconductor substrate 10, of the insulation film 16) so as to cover at least the opening 16a. The resin protrusion 18 is formed adjacent to the first metal layer 17. The second metal layer 20 is formed from an upper surface of the first metal layer 17 (or a surface, which is an opposite surface to a surface facing the insulation film 16, of the first metal layer 17) to an upper surface of the resin protrusion 18 (or a surface, which is an opposite surface to a surface facing the insulation film 16, of the resin protrusion 18).

As shown in FIG. 1A, the semiconductor substrate 10 may be formed in a chip state. That is, the semiconductor substrate 10 may be a semiconductor chip. Alternatively, the semiconductor substrate 10 may be in a wafer state (not shown). As shown in FIG. 1B, one surface of the semiconductor substrate 10 is the first surface 11. The semiconductor substrate 10 may be a silicon substrate, for example. The semiconductor substrate 10 may have a plurality of regions which respectively become semiconductor devices. As shown in FIG. 1B, the integrated circuit 12 is formed on the semiconductor substrate 10. The structure of the integrated circuit 12 is not specifically limited. For example, the integrated circuit 12 may include an active element such as a transistor or a passive element such as a resistor, a coil, and a capacitor. In a case where the semiconductor substrate 10 is formed in the chip state, a surface, on which the integrated circuit 12 is formed, (an active face) of the semiconductor substrate 10 may have a rectangular shape as shown in FIG. 1A.

As shown in FIG. 1B, the semiconductor substrate 10 includes the electrode 14 provided on the first surface 11 thereof. The electrode 14 may be electrically connected with the integrated circuit 12 formed inside the semiconductor substrate 10 with an internal wiring (not shown). The electrode 14 may be a part of the internal wiring of the semiconductor substrate 10. A region in which the electrode 14 is formed is not especially limited, but may be formed in a region other than a region in which the integrated circuit 12 is formed. Alternatively, the electrode 14 may be formed in a region in which the integrated circuit 12 is formed. Further, in a case where the active face of the semiconductor substrate 10 has a rectangular shape, the electrodes 14 may be aligned along a long side or a short side of the rectangular shape. The electrode 14 may be made of a metal such as aluminum (Al) and copper (Cu). Further, the semiconductor device 100 may include a plurality of electrodes 14 as shown in FIG. 1A.

The semiconductor substrate 10 is provided with the insulation film 16 as shown in FIG. 1B. The insulation film 16 may be a passivation film. The insulation film 16 may be formed so as to expose at least a part of the electrode 14. The insulation film 16 has the opening 16a positioned on at least a part of the upper surface of the electrode 14 as shown in FIG. 1B. The insulation film 16 may be an inorganic insulation film made of $SiO_2$ or SiN, for example. Alternatively, the insulation film 16 may be an organic insulation film made of polyimide resin, for example.

The first metal layer 17 is formed from the upper surface of the electrode 14 which is positioned under the opening 16a to the upper surface of the insulation film 16 as shown in FIG. 1B. The first metal film 17 may cover at least the whole region of the opening 16a so as not to expose any part of the electrode 14 in the inside of the opening 16a. Therefore, the first metal film 17 may be formed only in the inside of the opening 16a (not shown). Here, a part, which is formed on the electrode 14, of the first metal layer 17 may be defined as a first part 19 as shown in FIG. 1B. A shape of the first metal layer 17 is not especially limited. The first metal layer 17 may be extended in a direction in which the second metal layer 20 described later is extended, as shown in FIG. 1B. Further, the first metal layer 17 may be extended to a region in which the resin protrusion 18 described later is formed, or extended to a region, on the insulation film 16, between the opening 16a and the region in which the resin protrusion 18 is formed (not shown). The first metal layer 17 is made of a material which is hardly corroded by developer 50 described later. The first metal layer 17 is made of, for example, a material having alkaline resistance and conductivity. In particular, the first metal layer 17 is composed of a layer containing titanium-tungsten (Ti—W). Further, the semiconductor device 100 may include a plurality of first metal layers 17 as shown in FIG. 1A.

The resin protrusion 18 is formed adjacent to the first metal layer 17 on a surface, on which the electrode 14 is formed, of the semiconductor substrate 10, as shown in FIG. 1B. In the embodiment, a "formed adjacent" state may include a state that the first metal layer 17 and the resin protrusion 18 contact with each other as shown in FIG. 1B and a state that the first metal layer 17 and the resin protrusion 18 do not contact with each other (not shown). The resin protrusion 18 may be formed on the insulation film 16. The position on which the resin protrusion 18 is formed is not limited. For example, the resin protrusion 18 may be formed closer to the center of the semiconductor substrate 10 than the electrodes 14 when the electrodes 14 are formed along an end part of the semiconductor substrate 10. When the semiconductor substrate 10 has a rectangular outer shape, for example, the resin protrusion 18 may be formed in a manner to be extended along a long side of the substrate 10 as shown in FIG. 1A. The shape of the resin protrusion 18 is not especially limited. The resin protrusion 18 may have a curved surface as shown in FIG. 1B. For example, a surface, which is a surface opposed to the surface facing the insulation film 16, of the resin protrusion 18 may be curved. In this case, the resin protrusion 18 may have a nearly semicircular section at a part thereof with which the second metal layer 20 described later overlaps. A material of the resin protrusion 18 is not especially limited, and any known materials are applicable. For example, the resin protrusion 18 may be made of resin such as polyimide resin, silicone modified polyimide resin, epoxy resin, silicone modified epoxy resin, benzocyclobutene (BCB), polybenzoxazole (PBO), and phenolic resin. Further, the semiconductor device 100 may include a plurality of resin protrusions 18 as shown in FIG. 1A.

The second metal layer 20 is formed to cover the resin protrusion 18 in a manner to be electrically connected with the first metal layer 17 and the electrode 14 as shown in FIG. 1B. The second metal layer 20 may be a wiring. As shown in FIG. 1B, the second metal layer 20 may be formed from a part (first part), overlapping with the electrode 14, of the first metal layer 17 to an upper surface of the resin protrusion 18. When the first metal layer 17 is formed in a manner not to be adjacent to the region in which the resin protrusion 18 is formed, the second metal layer 20 may be formed from the upper surface of the first metal layer 17 through the upper surface of the insulation film 16 to the upper surface of the resin protrusion 18 (not shown). A structure and a material of the second metal layer 20 are not especially limited. For example, the second metal layer 20 may be formed in a single layer state. Alternatively, the second metal layer 20 may be formed in a multiple layer state as shown in FIG. 1B. In this case, the second metal layer 20 may include a first layer 26 made of titanium-tungsten (Ti—W) or titanium (Ti) and a second layer 27 made of gold (Au), for example. Further, the semiconductor device 100 may include a plurality of second metal layers 20 as shown in FIG. 1A. In this case, the plurality of second metal layers 20 may be formed to stride over a single resin protrusion 18. Alternatively, a single second metal layer 20 may be formed to correspond to a single resin protrusion 18 (not shown). When a single second metal layer 20 is formed to correspond to a single resin protrusion 18, the resin protrusion 18 may have a semispherical shape (not shown).

The semiconductor device 100 of the first embodiment has the following advantageous points, for example.

According to the semiconductor device 100 of the first embodiment, the surface of the electrode 14 inside the opening 16a can be protected by the first metal layer 17 in a manufacturing process of the device. Details of the manufacturing process will be described later.

According to the semiconductor device 100 of the first embodiment, a semiconductor device having high connecting reliability between the electrode 14 and the second metal layer 20 which is a wiring can be obtained.

1-2 Method for Manufacturing Semiconductor Device

A method for manufacturing a semiconductor device according to the first embodiment will now be described with reference to the accompanying drawings.

FIGS. 2A to 4C are sectional views schematically showing a main part for explaining a method for manufacturing a semiconductor device according to the present embodiment.

The method for manufacturing a semiconductor device according to the first embodiment includes: a) preparing a structure 1; b) forming the first metal layer 17; c) forming a resin layer 30; d) forming the resin protrusion 18; and e) forming the second metal layer 20, as shown in FIGS. 2A to 4C. The structure 1 in the step a) includes the semiconductor substrate 10, the electrode 14 formed on the first surface 11 of the semiconductor substrate 10, and the insulation film 16 formed on the first surface 11 and having the opening 16a positioned on the electrode 14. In the step b), the first metal layer 17 is formed from the upper surface of the electrode 14 (or a surface, which is an opposite surface to a surface facing the semiconductor substrate 10, of the electrode 14) positioned inside the opening 16a to the upper surface of the insulation film 16 (or a surface, which is an opposite surface to a surface facing the semiconductor substrate 10, of the insulation film 16). In the step c), the resin layer 30 is formed on the first metal layer 17, covering the electrode 14, (or a surface, which is an opposite surface to a surface facing the insulation film 16, of the first metal layer 17) and on the insulation film 16 after the step b). In the step d), the resin protrusion 18 is formed by removing at least a part, positioned on the electrode 14 and the first metal layer 17, of the resin layer 30. In the step e), the second metal layer 20 is formed from the upper surface of the first metal layer 17 to the upper surface of the resin protrusion 18 in a manner to be electrically coupled with the electrode 14.

Figure 2A:
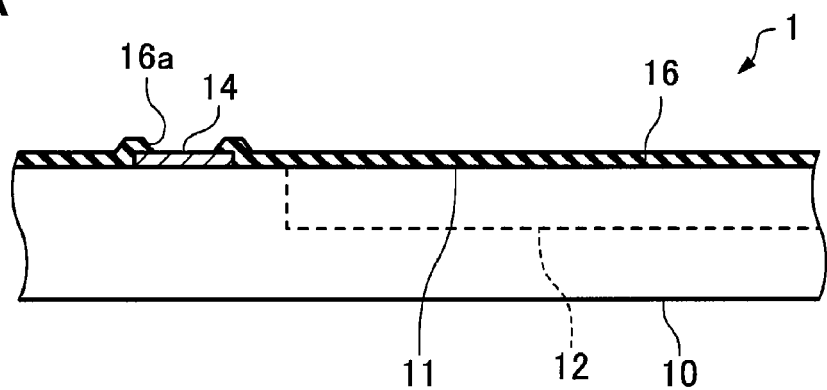
FIGS. 2A and 2B are sectional views schematically showing a main part for explaining a method for manufacturing a semiconductor device according to the first embodiment of the invention.

As shown in FIG. 2A, the structure 1 having the electrode 14 and the insulation film 16 that are provided on the semiconductor substrate 10 (which is a semiconductor wafer or a chip) is prepared. The electrode 14 and the insulation film 16 have been described above, so that their detailed descriptions will not be repeated here.

Figure 2B:
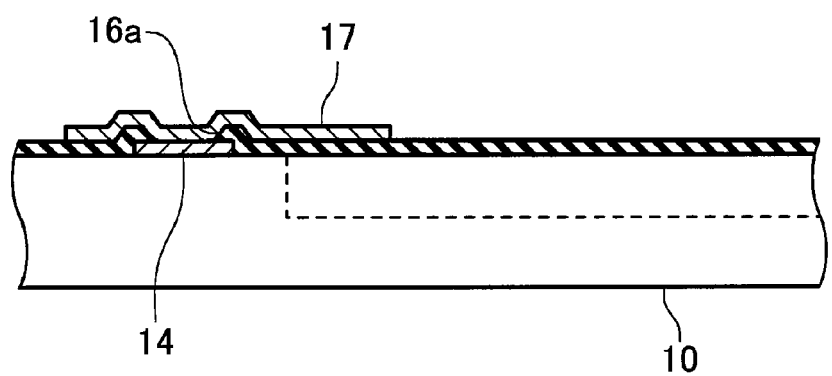

As shown in FIG. 2B, the first metal layer 17 is formed from the upper surface of the electrode 14 positioned inside the opening 16a to the upper surface of the insulation film 16. The first metal layer 17 may be formed by a known technique such as sputtering. Subsequently, patterning (etching) is performed to obtain a desired shape, thus forming the first metal layer 17. Here, the patterning is performed so as to cover at least the electrode 14 positioned inside the opening 16a in forming the first metal layer 17.

Figure 3A:
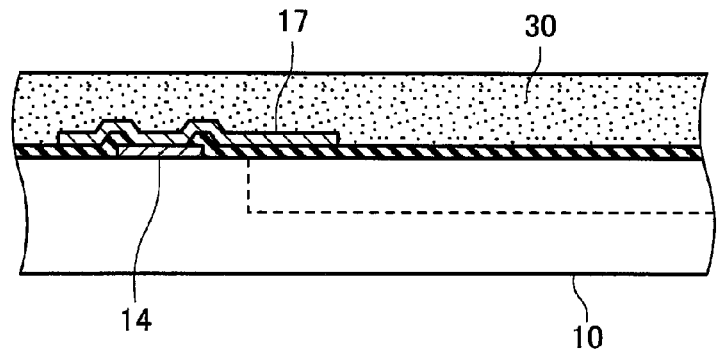
FIGS. 3A to 3C are sectional views schematically showing a main part for explaining the method for manufacturing a semiconductor device according to the first embodiment of the invention.

After the step b) in which the first metal layer 17 is formed, the resin layer 30 which is a resin precursor layer is formed on the first metal layer 17, which covers the electrode 14, and on the insulation film 16 as shown in FIG. 3A. The resin layer 30 may be formed to cover the whole of the first surface 11 of the structure 1. The resin layer 30 may be pre-baked after its application. The resin layer 30 may have a sheet-like shape. The resin layer 30 may have a thermosetting property or a photo-setting property. In the embodiment, a manufacturing method using the resin layer 30 having a thermosetting property will be described as an example. The resin layer 30 may be made of photo-sensitive resin. For example, the resin layer 30 may be made of resin such as polyimide resin, silicone modified polyimide resin, epoxy resin, silicone modified epoxy resin, benzocyclobutene (BCB), polybenzoxazole (PBO), phenolic resin, and acrylic resin.

Figure 3B:
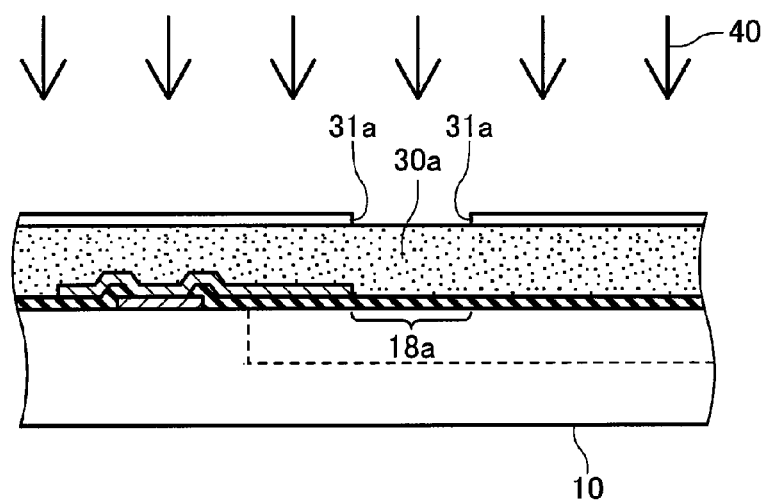
Figure 3C:
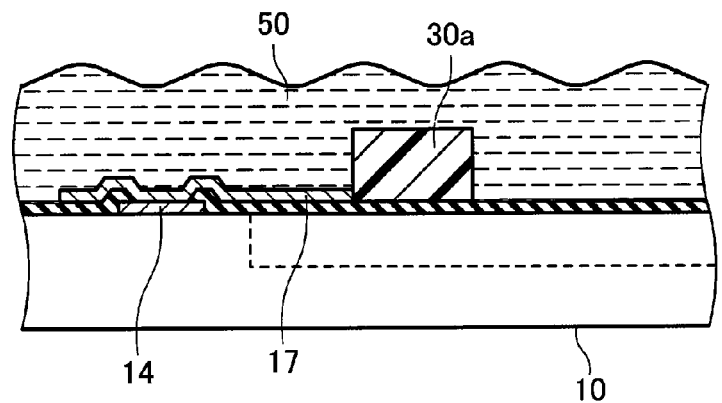

The step d) in which the resin protrusion 18 is formed includes: patterning the resin layer 30 (not shown); and removing a part (a second part) of the resin layer 30 by the developer 50 so as to form the resin layer 30 having a desirable shape as respectively shown in FIGS. 3B and 3C.

As shown in FIG. 3B, a mask 31 having an opening 31a is disposed on a predetermined position on the resin layer 30. In a case where the resin layer 30 is a positive-type resist, the mask 31 is disposed such that the resin layer 30 is exposed to light in a region on which the resin protrusion 18 is formed. In a case where the resin layer 30 is a negative-type resist, the mask 31 may be disposed in the region on which the resin protrusion 18 is formed (not shown). The mask 31 is made of any material as long as the mask 31 has a light shielding property, and, for example, may be a glass plate on which a light-shielding film made of chrome or the like is formed. After the mask 31 is disposed on the predetermined position, an exposure treatment is performed by irradiating with ultraviolet rays 40, for example, emitted from a light source lamp (not shown). A part (the first part), which is exposed to light inside the opening 31a, of the resin layer 30a by the exposure treatment may be cured.

Here, the region on which the resin protrusion 18 is formed is defined as a region 18a. As shown FIG. 3B, a region on which the opening 31a, which is an exposed region, of the mask 31 is disposed may be defined as the region 18a. That is, the region 18a is set in designing. The region 18a may be a region in which the resin layer 30a can be flatly deformed and expanded in a horizontal direction when the resin layer 30a is heated in forming the resin protrusion 18.

As shown in FIG. 3C, after the exposure treatment, the resin layer 30 other than the resin layer 30a is developed by a developing treatment using the developer 50 so as to be removed. Here, at least a part, which is formed on the first part 19 of the first metal layer 17, of the resin layer 30 (second part) is removed. The developer 50 used in the treatment has stronger corrosivity to the electrode 14 than corrosivity to the first metal layer 17. Here, the developer 50 may be alkaline developer. The developer 50 may be organic alkaline developer, for example. As described above, the alkaline developer has strong corrisivity to a metal such as aluminum. However, in the developing treatment of the embodiment, the first metal layer 17 containing titanium-tungsten which is hardly corroded by the developer 50 is formed to cover the electrode 14 containing aluminum. Accordingly, the electrode 14 can be protected from the developer 50. That is, the first metal layer 17 can prevent damage on the upper surface of the electrode 14 in the manufacturing process, maintaining connecting reliability between the electrode 14 and the second metal layer 20 which is a wiring.

Figure 4A:
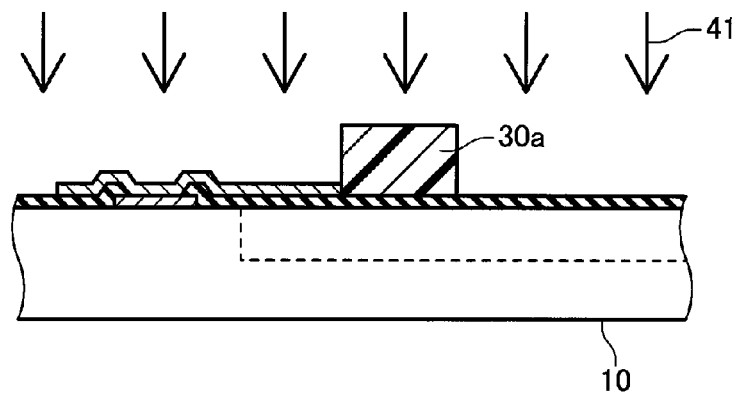
FIGS. 4A to 4C are sectional views schematically showing the main part for explaining the method for manufacturing a semiconductor device according to the first embodiment of the invention.
Figure 4B:
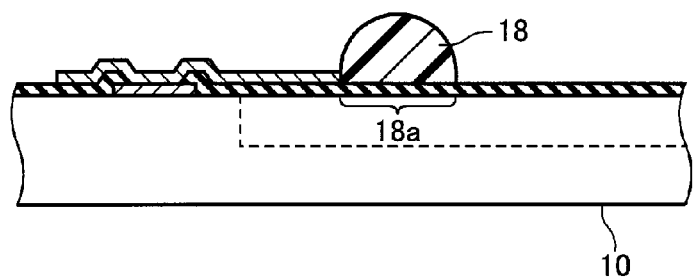

The step d) in which the resin protrusion 18 is formed further includes: performing a heating treatment so as to deform the resin layer 30a, as shown in FIGS. 4A and 4B.

A method of the heating is not especially limited. For example, the resin layer 30a may be heated by being irradiated with infrared rays 41 radiated from a heat source which is not shown, as shown in FIG. 4A. The heating decreases the viscosity of the resin layer 30a, and the resin layer 30a can be deformed due to its own weight and surface tension. As a result, the resin protrusion 18 of which an upper surface has a smoothly-curved shape and a section has a nearly semicircular shape is formed as shown in FIG. 4B.

Figure 4C:
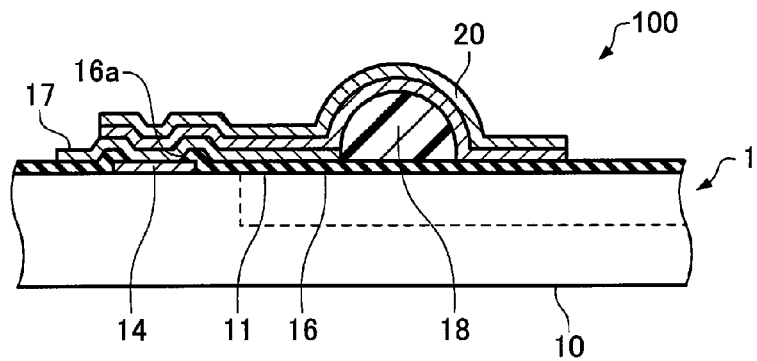

After the resin protrusion 18 is formed, the second metal layer 20 is formed from the upper surface of the first metal layer 17 to the upper surface of the resin protrusion 18 as shown in FIG. 4C. Here, the second metal layer 20 is electrically connected with the electrode 14 through the first metal layer 17. The second metal layer 20 may be formed by, for example, forming a conductive film made of a metal on the whole surface of the structure 1 including a part, which overlaps with the electrode 14, of the metal layer 17 and the upper surface of the resin protrusion 18 (not shown) and patterning (etching) the conductive film to a predetermined shape. As described above, the second metal layer 20 may be composed of a single layer containing gold, or composed of a plurality of layers including the first layer 26 made of titanium-tungsten and the second layer 27 made of gold, for example. FIGS. 1B and 4C show the first metal layer 17 having a part protruding from the second metal layer 20. However, the second metal layer 20 may be formed to cover the whole surface, which is an opposite surface to a surface facing the insulation film 16, of the first metal layer 17.

When the semiconductor substrate 10 is the semiconductor wafer, the semiconductor substrate 10 may cut to have a desired size after the second metal layer 20 is formed, forming the semiconductor device 100 (not shown).

The method for manufacturing a semiconductor device of the first embodiment has the following advantageous points, for example.

According to the method for manufacturing a semiconductor device of the first embodiment, an exposed part of the electrode 14 positioned inside the opening 16a can be protected from the developer 50 by the first metal layer 17 in the manufacturing process. Further, Al—Au diffusion, which is caused by damage of the electrode 14, between the electrode 14 containing aluminum and the wiring containing gold (the second metal layer 20) can be prevented, being able to maintain connecting reliability between the electrode 14 and the wiring (the second metal layer 20) and heat resistance.

According to the method for manufacturing a semiconductor device of the first embodiment, a semiconductor device having high connecting reliability between an electrode and a wiring can be manufactured.

2. Second Embodiment 2-1 Semiconductor Device

A semiconductor device according to a second embodiment will now be described with reference to the accompanying drawings.

Figure 5A:
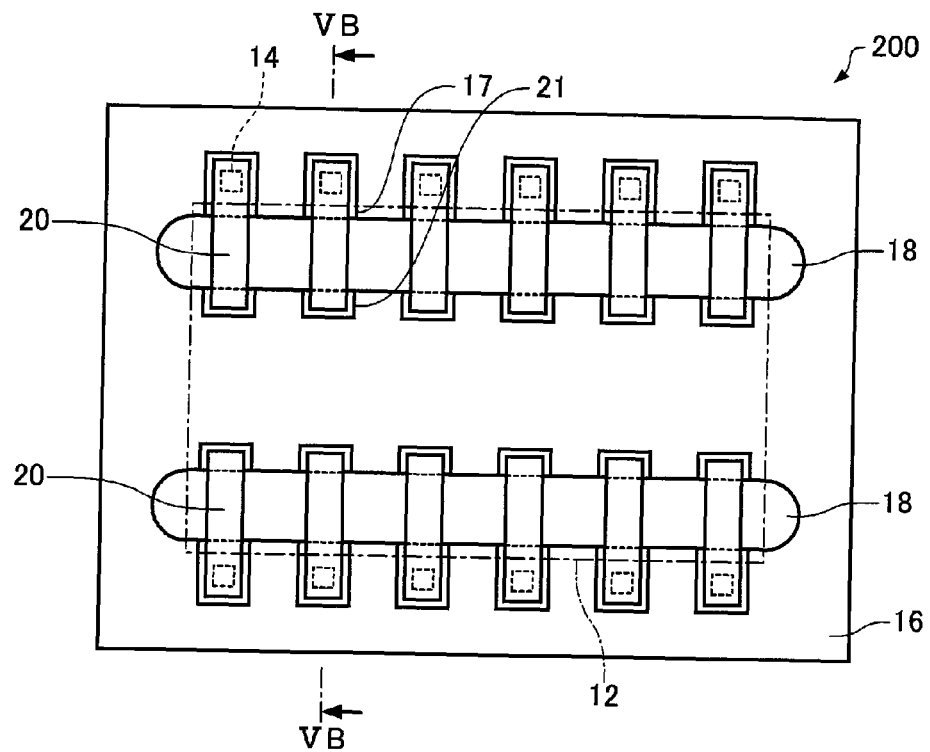
FIG. 5A is a plan view schematically showing a semiconductor device 200 according to a second embodiment.
Figure 5B:
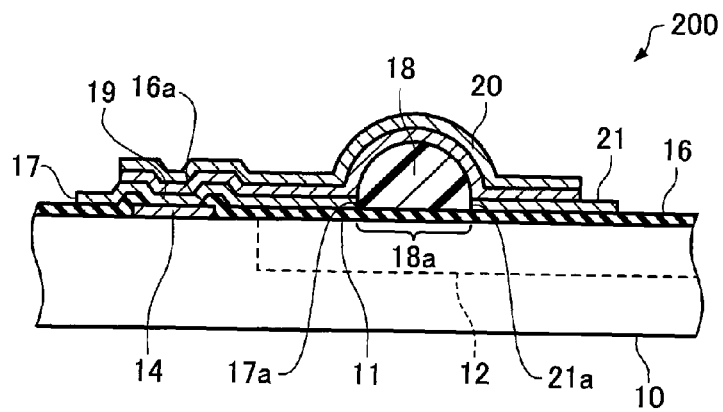
FIG. 5B is a sectional view schematically showing a main part of a section taken along a VB-VB line of the semiconductor device 200 shown in FIG. 5A.

FIG. 5A is a plan view schematically showing a semiconductor device 200 according to the second embodiment. FIG. 5B is a sectional view schematically showing a main part of a section taken along a VB-VB line of the semiconductor device 200 shown in FIG. 5A.

The different points from the first embodiment are that the semiconductor device 200 further includes a third metal layer 21 formed on the upper surface of the insulation film 16 (a surface, which is opposed to a surface facing the semiconductor substrate 10, of the insulation film 16) separately from the first metal layer 17, and that the resin protrusion 18 is formed between the first metal layer 17 and the third metal layer 21. Structures different from those of the first embodiment will be described below. In the description below of the semiconductor device according to the second embodiment, structures and manufacturing steps same as those of the first embodiment are given the same numerals and symbols as those of the first embodiment, and detailed description thereof will not be repeated.

The first metal layer 17 is formed from the upper surface of the electrode 14 which is positioned inside the opening 16a to the upper surface of the insulation film 16 as shown in FIG. 5B. Here, an end part of the first metal layer 17 facing the region 18a in which the resin protrusion 18 is formed is defined as an end part 17a, as shown in FIG. 5B. The first metal layer 17 of the second embodiment is formed such that the end part 17a is adjacent to the region 18a. It is only necessary for the end part 17a to be formed adjacent to the region 18a. The end part 17a may contact with the resin protrusion 18 as shown in FIG. 5B, and is not required to contact with the resin protrusion 18 (not shown).

The third metal layer 21 is formed on the insulation film 16 separately from the first metal layer 17 as shown in FIG. 5A. As shown in FIG. 5B, the third metal layer 21 is disposed on a region which is opposed to the first metal layer 17 across the region 18a. Here, an end part of the third metal layer 21 which faces the region on which the resin protrusion 18 is formed is defined as an end part 21a. The third metal layer 21 is formed such that the end part 21a is adjacent to the region 18a. It is only necessary for the end part 21a to be formed adjacent to the region 18a. The end part 21a may contact with the resin protrusion 18 as shown in FIG. 5B, and is not required to contact with the resin protrusion 18 (not shown). A shape of the third meal layer 21 is not especially limited. The third metal layer 21 may be formed to be extended in a direction in which the second metal layer 20 is extended, for example, as shown in FIG. 5B. The third metal layer 21 may be made of the same material as that of the first metal layer 17, and may be composed of a layer containing titanium-tungsten (Ti—W), for example. However, the material is not especially limited, and metals used in known wirings may be used. Further, the semiconductor device 200 may include a plurality of third metal layers 21 as shown in FIG. 5A. FIG. 5B shows the third metal layer 21 having a part protruding from the second metal layer 20. However, the second metal layer 20 may be formed to cover the whole surface, which is an opposite surface to a surface facing the insulation film 16, of the third metal layer 21.

A case where the end parts 17a and 21a do not contact with the resin protrusion 18 may be a case where the resin layer 30a is deformed at an extent not to reach a circumference of the region 18a when the resin layer 30a is heated, for example. Details will be described later.

The resin protrusion 18 of the second embodiment is formed between the first metal layer 17 and the third metal layer 21 as shown in FIG. 5B.

The semiconductor device 200 of the second embodiment has the advantageous points same as those of the device of the first embodiment, and further has the following advantageous point, for example.

According to the semiconductor device 200 of the second embodiment, the first metal layer 17 and the third metal layer 21 are formed adjacent to the region 18a on which the resin protrusion 18 is formed, being able to prevent the resin protrusion 18 from being formed in a region other than the region 18a when the resin protrusion 18 is formed. That is, the shape of the resin protrusion 18 can be physically controlled. The controlling process of the resin protrusion 18 is described in detail later.

According to the semiconductor device 200 of the second embodiment, a semiconductor device having high connecting reliability between an electrode and a wiring and including the resin protrusion 18 having a controlled shape can be provided.

2-2 Method for Manufacturing Semiconductor Device

A method for manufacturing a semiconductor device according to the second embodiment will now be described with reference to the accompanying drawings.

FIGS. 6A to 7C are sectional views schematically showing a main part for explaining a method for manufacturing a semiconductor device according to the present embodiment.

The different points from the first embodiment are that the method of the present embodiment further includes a step of forming the third metal layer 21, and the resin protrusion 18 is formed between the first metal layer 17 and the third metal layer 21. Structures different from those of the first embodiment will be described below. In the description below of the method for manufacturing a semiconductor device according to the second embodiment, structures and manufacturing steps same as those of the first embodiment are given numerals and symbols same as those of the first embodiment, and detailed description thereof will not be repeated.

In the present embodiment, the first metal layer 17 is formed from the upper surface of the electrode 14 positioned inside the opening 16a to the upper surface of the insulation layer 16 as is the case with the first embodiment. Detailed structures are same as those described above. Further, in the method of the present embodiment, the end part 17a is formed adjacent to the region 18a on which the resin protrusion 18 is formed, as shown in FIG. 6A.

Figure 6A:
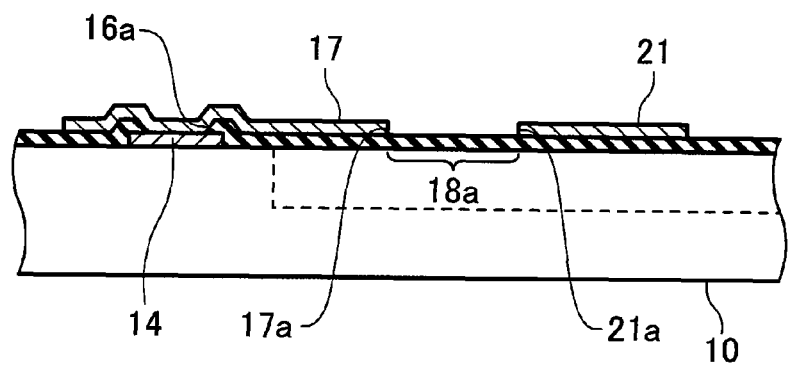
FIGS. 6A and 6B are sectional views schematically showing a main part for explaining a method for manufacturing a semiconductor device according to the second embodiment of the invention.

The third metal layer 21 is formed separately from the first metal layer 17 across the region 18a as shown in FIG. 6A. The end part 21a, facing the region 18a, of the third metal layer 21 is formed adjacent to the region 18a to be opposed to the end part 17a. Here, the first metal layer 17 and the third metal layer 21 may be formed in a single step. The third metal layer 21 may be made of the same material as that of the first metal layer 17.

Figure 6B:
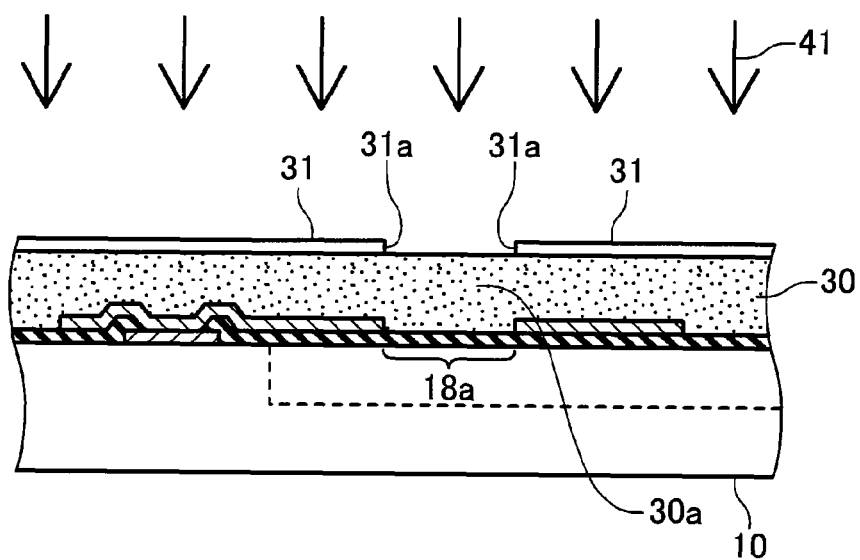

The step of forming the resin protrusion 18 of the second embodiment includes a step of forming the resin protrusion 18 between the first metal layer 17 and the third metal layer 21 as described above. As shown in FIG. 6B, the resin layer 30 is formed as is the case with the first embodiment. In the present embodiment, the mask 31 for performing an exposure treatment for the resin layer 30 may be positioned such that the opening 31a of the mask 31 is positioned on the circumference of the region 18a as shown in FIG. 6B. Accordingly, the resin protrusion 18 can be formed between the first metal layer 17 and the third metal layer 21. The opening 31a may be positioned more inside than the circumference of the region 18a, though it is not shown.

Figure 7A:
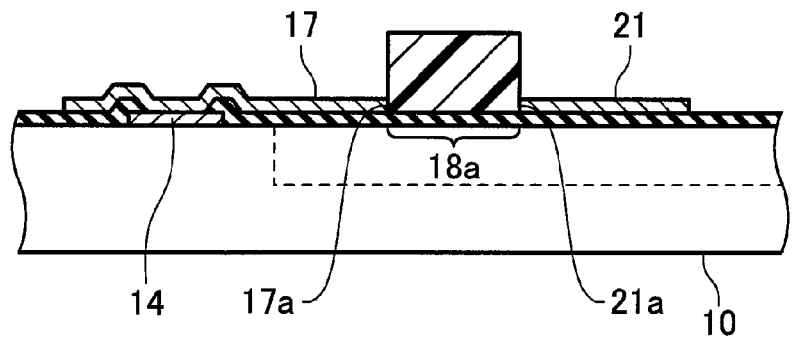
FIGS. 7A to 7C are sectional views schematically showing the main part for explaining the method for manufacturing a semiconductor device according to the second embodiment of the invention.

The step of forming the resin protrusion 18 of the second embodiment includes performing the exposure treatment for the resin layer 30a and subsequently performing the developing treatment with the developer 50 as is the case with the first embodiment (refer to FIGS. 3B and 3C). After the developing treatment, the resin layer 30a is left between the end part 17a and the end part 21a as shown in FIG. 7A. In the case where the opening 31a is formed more inside than the circumference of the region 18a, the resin layer 30a does not contact with the end part 17a and the end part 21a (not shown).

Figure 7B:
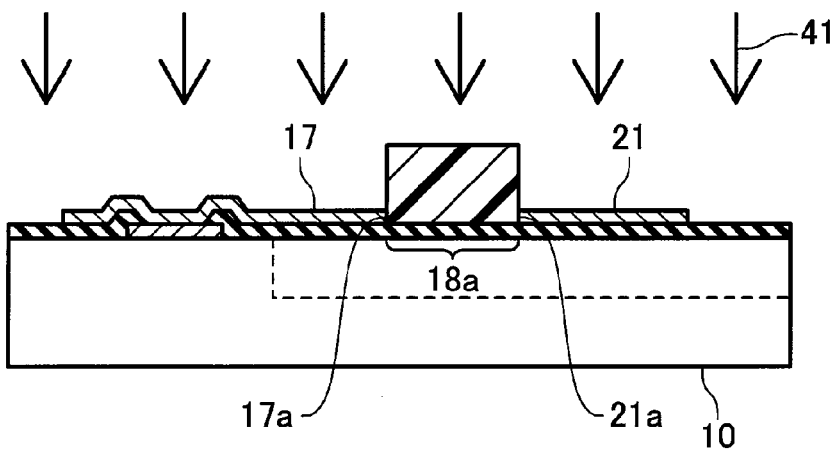
Figure 7C:
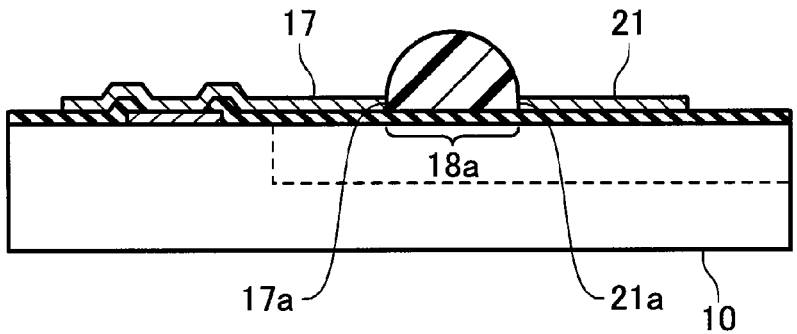

The step of forming the resin protrusion 18 of the present embodiment further includes, likewise the first embodiment, performing a heating treatment so as to deform the resin layer 30a as shown in FIGS. 7B and 7C.

The method of the heating is not especially limited. For example, the resin layer 30a may be heated by being irradiated with infrared rays 41 emitted from a heat source which is not shown, as shown in FIG. 7B. The heating decreases the viscosity of the resin layer 30a, and the resin layer 30a can be deformed due to its own weight and surface tension. At this time, the resin layer 30a is supposed to deform in a horizontal direction (for example, flatly deform). However, since the resin layer 30a is sandwiched by steps of the end part 17a of the first metal layer 17 and the end part 21a of the third metal layer 21, the resin layer 30a can be prevented from excessively deforming, thus being able to limit the deformation within the region 18a. That is, the shape of the resin protrusion 18 can be controlled.

The first metal layer 17 and the third metal layer 21 are made of a metal having a liquid repellency property with respect to resin. That is, the resin layer 30a has high wettability with respect to the insulation film 16 also made of a resin, but has low wettability with respect to the first metal layer 17 and the third metal layer 21 made of a metal. In other words, a contact angle θ showing wettability of the resin layer 30a with respect to the first metal layer 17 and the third metal layer 21 is large. Consequently, controllability of the resin protrusion 18 is improved due to an act of surface tension, so that the resin protrusion 18 of which the shape is controlled can be formed within the region 18a as shown in FIG. 7C.

Here, in a case where the resin layer 30a is formed more inside than the circumference of the region 18a, the resin layer 30a is permitted to deform until the resin layer 30a contact with the end parts 17a and 21a, and the deformation may be stopped when the resin layer 30a contacts with the end parts 17a and 21a. In a case where the resin layer 30a obtains a desired shape before the layer 30a contacts with the end parts 17a and 21a, the deformation may be stopped before the contact (not shown).

The semiconductor device 200 of the present embodiment may be manufactured through the above process.

The method for manufacturing a semiconductor device of the second embodiment has the advantageous points same as those of the method of the first embodiment, and further has the following advantageous point, for example.

According to the method for manufacturing a semiconductor device of the present embodiment, when the resin layer 30a is heated to be deformed, the deformation of the resin layer 30a can be limited within the region 18a by the first metal layer 17 and the third metal layer 21 in the step of forming the resin protrusion 18. That is, the deformation of the resin protrusion 18 can be controlled, being able to form the resin protrusion 18 having a desired shape.

According to the method for manufacturing a semiconductor device of the second embodiment, a semiconductor device having high connecting reliability between an electrode and a wiring and including the resin protrusion 18 having a controlled shape can be manufactured.

2-3 Modification

A semiconductor device and a method for manufacturing a semiconductor device according to a modification of the second embodiment will now be described with reference to the accompanying drawings.

Figure 8A:
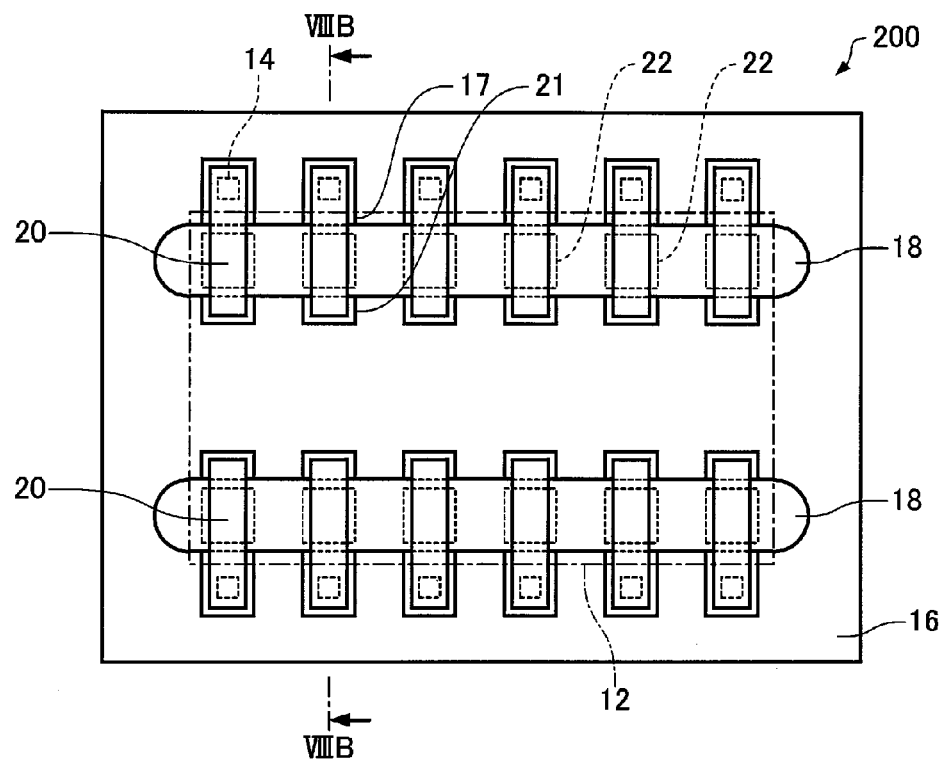
FIG. 8A is a plan view schematically showing a modification of the second embodiment.
Figure 8B:
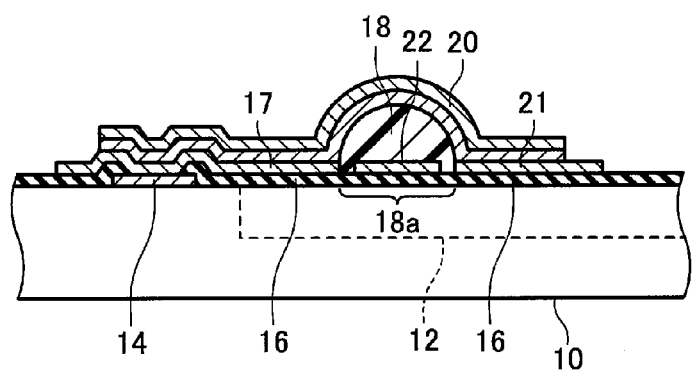
FIG. 8B is a sectional view schematically showing a main part of a section taken along a VIIIB-VIIIB line of a semiconductor device 200 shown in FIG. 8A.

FIG. 8A is a plan view schematically showing a semiconductor device 200 according to the modification of the second embodiment. FIG. 8B is a sectional view schematically showing a main part of a section taken along a VIIIB-VIIIB line of the semiconductor device 200 shown in FIG. 8A.

The different point of the modification from the second embodiment is that a fourth metal layer 22 is further formed on the insulation film 16 so as to be positioned between the first metal layer 17 and the third metal layer 21, and the resin protrusion 18 is formed on the fourth metal layer 22. Structures different from those of the second embodiment will be described below. In the description below of the semiconductor device and the method for manufacturing a semiconductor device according to the modification of the second embodiment, structures and manufacturing steps same as those of the second embodiment are given the same numerals and symbols as those of the second embodiment, and detailed description thereof will not be repeated.

The fourth metal layer 22 is formed between the first metal layer 17 and the third metal layer 21 as shown in FIGS. 8A and 8B. That is, it is only necessary that the fourth metal layer 22 is formed within the region 18a, on which the resin protrusion 18 is formed, separately from the first metal layer 17 and the third metal layer 21. The fourth metal layer 22 may be formed concurrently with the first metal layer 17 and the third metal layer 21 with the same material as that of the third metal layer 21. Further, the semiconductor device 200 may include a plurality of fourth metal layers 22 as shown in FIG. 8A.

The semiconductor device and the method for manufacturing a semiconductor device of the modification have the advantageous points same as those of the device and the method of the second embodiment, and further have the following advantageous point, for example.

According to the semiconductor device and the method for manufacturing the same of the modification, the fourth metal layer 22 having low wettability is formed within the region 18a. Accordingly, when the resin layer 30a is deformed by the heat treatment, the deformation of the resin layer 30a can be controlled by using difference between wettability of the fourth metal layer 22 and wettability of the insulation film 16 exposed between the first metal layer 17 and the fourth metal layer 22 and between the third metal layer 21 and the fourth metal layer 22, in the step of forming the resin protrusion 18. That is, a central part of the region 18a on which the deformation is required to be progressed and a circumference part of the region 18a on which the deformation is required to be controlled can be formed by forming the fourth metal layer 22. Consequently, the resin protrusion 18 having a desired shape can be formed.

According to the semiconductor device and the method for manufacturing the same of the modification, a semiconductor device having high connecting reliability between an electrode and a wiring and including the resin protrusion 18 having a controlled shape can be manufactured.

3. Third Embodiment

3-1 Semiconductor Device

A semiconductor device according to a third embodiment will now be described with reference to the accompanying drawings.

Figure 9A:
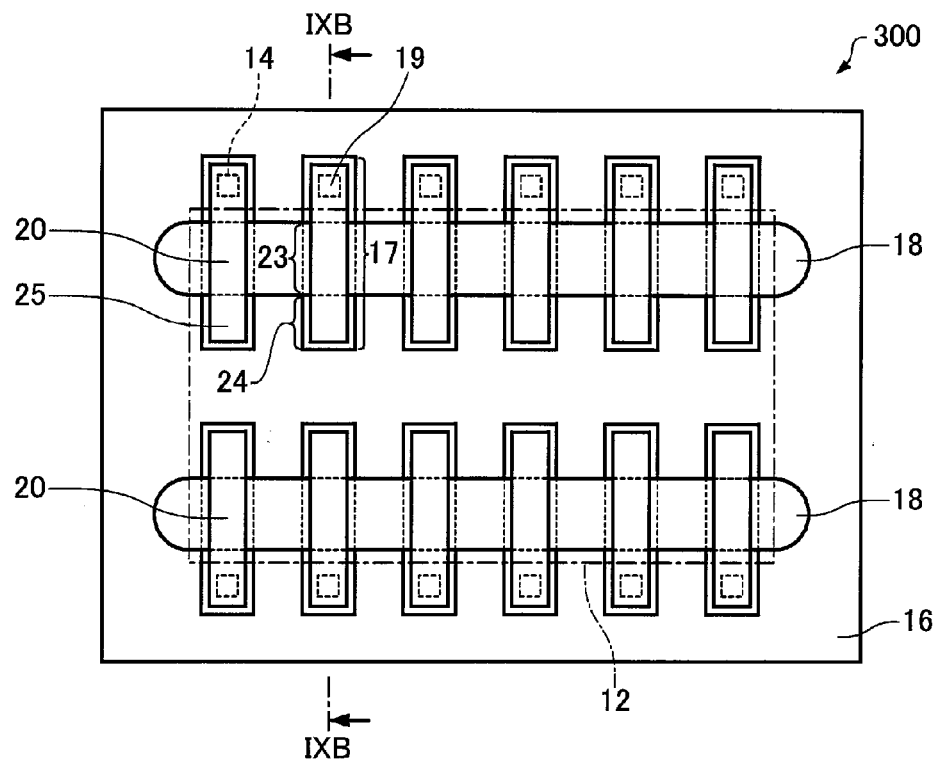
FIG. 9A is a plan view schematically showing a semiconductor device 300 according to a third embodiment.
Figure 9B:
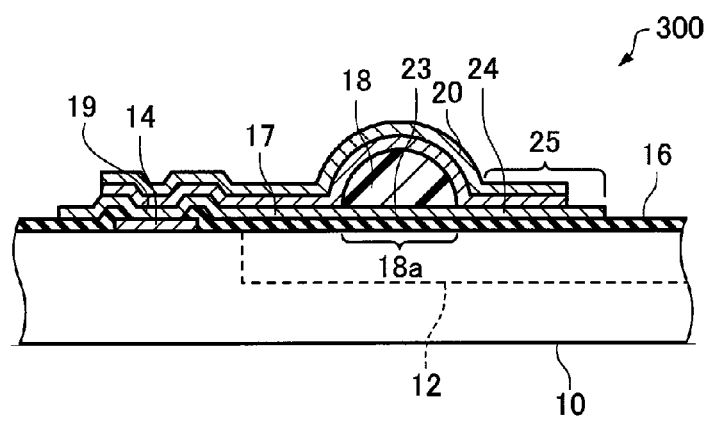
FIG. 9B is a sectional view schematically showing a main part of a section taken along a IXB-IXB line of the semiconductor device 300 shown in FIG. 9A.

FIG. 9A is a plan view schematically showing a semiconductor device 300 according to the third embodiment. FIG. 9B is a sectional view schematically showing a main part of a section taken along a IXB-IXB line of the semiconductor device 300 shown in FIG. 9A.

The different point of the semiconductor device 300 from the device of the first embodiment is that the first metal layer 17 has a third part 23 positioned between the first part 19 and a second part 24 thereof on the insulation film 16, and the resin protrusion 18 is formed on the third part 23. Structures different from those of the first embodiment will be described below. In the description below of the semiconductor device according to the third embodiment, structures and manufacturing steps same as those of the first embodiment are given the same numerals and symbols as those of the first embodiment, and detailed description thereof will not be repeated.

The second part 24 is a part of the first metal layer 17 as shown in FIG. 9A. The third part 23 is also a part of the first metal layer 17 and is positioned between the first part 19 and the first part 24 of the first metal layer 17 as shown in FIG. 9A. In other words, the second part 24 is a part continuously formed from the third part 23. The third part 23 is the region 18a on which the resin protrusion 18 is formed as shown in FIG. 9B. Further, as shown in FIG. 9A, the semiconductor device 300 may include a plurality of first metal layers 17 and each of the first metal layers 17 may include the second part 24 and the third part 23.

The second metal layer 20 may be formed to overlap with the second part 24 as shown in FIG. 9B, and is not required to overlap with the second part 24 (not shown).

As shown in FIG. 9B, a pad part 25 composed of an upper surface part of the second part 24 or an upper surface part of the second metal layer 20 overlapping with the second part 24 may have an enough area to inspect an electrical characteristic of the semiconductor device 300, for example. The pad part 25 is electrically connected with the electrode 14 through the first metal layer 17 including the third part 23. Even if the pad part 25 is physically damaged on its surface, the conduction between the electrode 14 and a part, which overlaps with the resin protrusion 18, of the second metal layer 20 is not influenced. Accordingly, the pad part 25 can be used as an inspection pad for electrical characteristic inspection.

The semiconductor device 300 of the third embodiment has the advantageous points same as those of the device of the first embodiment, and further has the following advantageous point, for example.

According to the semiconductor device of the present embodiment, a semiconductor device including the resin protrusion 18 which is formed on the third part 23 so as to have a controlled shape can be provided. Details will be described later.

According to the semiconductor device of the third embodiment, a semiconductor device including the pad part 25 which can be used as an inspection pad can be provided.

For example, the second part 24 can be used as an inspection pad for conduction inspection between the electrode 14 and the integrated circuit 12 electrically connected with the electrode 14. In a case where inspection probes are pressed on the first metal layer 17 formed on the electrode 14, the second metal layer 20, and a part, which overlaps with the resin protrusion 18, of the second metal layer 20 for inspection and surfaces are damaged, reliability of electrical-connection of the semiconductor device may be degraded. In contrast, even if an inspection probe is pressed on the second part 24 and is physically damaged, reliability of electrical-connection is not degraded. Further, the second part 24 can be formed to have an enough area to easily set the inspection probe, whereby an electrical characteristic can be easily inspected.

For example, in a case where the semiconductor device is a driver device including an element composed of a recording medium such as a ROM, data is once inputted into the ROM, a heating treatment is performed on the semiconductor device, and the data is outputted from the ROM which is heated so as to inspect whether the data is changed or not, thus inspecting reliability. In this case, the second part 24 may be used as a data output pad.

According to the semiconductor device 300 of the third embodiment, a semiconductor device which has high connecting reliability between an electrode and a wiring and includes the resin protrusion 18 having a controlled shape, and of which an electrical characteristic can be easily and safely inspected can be provided.

3-2 Method for Manufacturing Semiconductor Device

A method for manufacturing a semiconductor device according to the third embodiment will now be described with reference to the accompanying drawings.

Figure 10A:
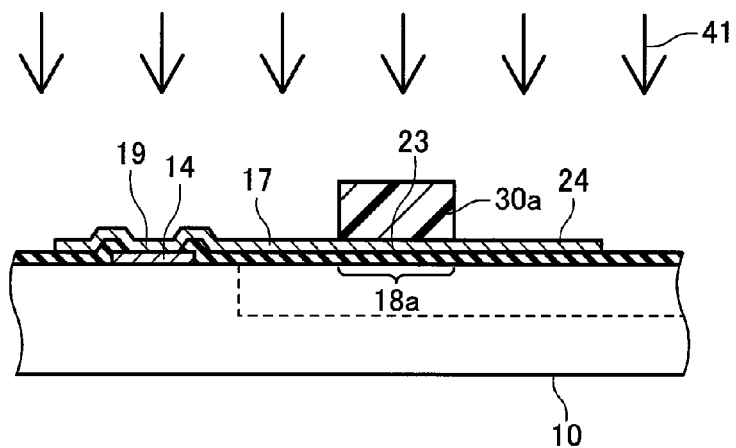
FIGS. 10A to 10C are sectional views schematically showing a main part for explaining a method for manufacturing a semiconductor device according to the third embodiment of the invention.
Figure 10B:
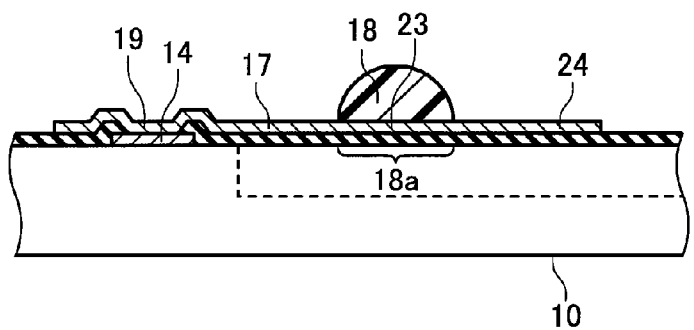
Figure 10C:
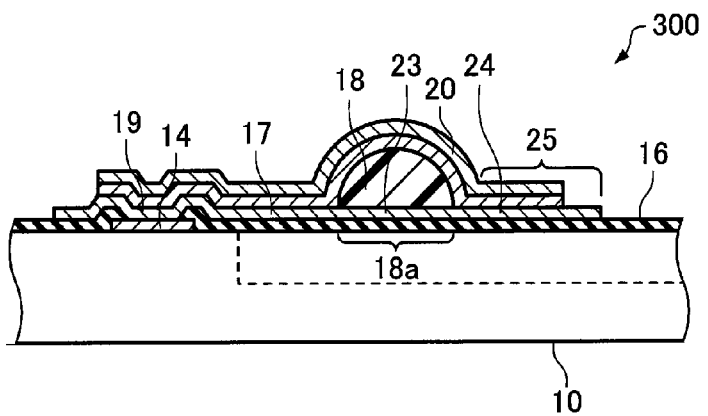

FIGS. 10A to 10C are sectional views schematically showing a main part for explaining a method for manufacturing a semiconductor device according to the present embodiment.

The different point from the first embodiment is that the first metal layer 17 has the third part 23 positioned between the first part 19 and the second part 24 thereof on the insulation film 16, and the resin protrusion 18 is formed on the third part 23. Structures different from those of the first embodiment will be described below. In the description below of the method for manufacturing a semiconductor device according to the third embodiment, structures and manufacturing steps same as those of the first embodiment are given the same numerals and symbols as those of the first embodiment, and detailed description thereof will not be repeated.

According to the method for manufacturing a semiconductor device of the third embodiment, the first metal layer 17 is formed to include the third part 23 which is positioned between the second part 24 and the first part 19 positioned on the electrode 14.

As described above, the resin protrusion 18 is formed on the third part 23 in the semiconductor device 300 of the third embodiment (refer to FIG. 9B). As is the case with the first embodiment, the resin layer 30 is formed, the mask 31 is disposed so as to position the opening 31a thereof above the third part 23, and the exposure treatment and the developing treatment are performed (refer to FIGS. 3A to 3C). After the resin layer 30a is formed on the third part 23 as shown in FIG. 10A, the heating treatment is performed so as to deform the resin layer 30a and thus form the resin protrusion 18 as shown in FIG. 10B. Here, when the resin layer 30a is deformed, the whole of a bottom part of the resin layer 30a contacts with the third part 23 which is made of a metal as shown in FIG. 10A. As described above, the resin layer 30a is made of resin, so that the resin layer 30a has low wettability with respect to metal. Surface tension acts on the whole surface of the contacting part between the resin layer 30a and the third part 23, so that the deformation of the resin layer 30a can be suppressed and controlled. Consequently, controllability of the shape of the resin protrusion 18 is improved, so that the resin protrusion 18 of which the shape is controlled can be formed within the region 18a as shown in FIG. 10B. After the formation of the resin protrusion 18, the second metal layer 20 is formed as shown in FIG. 10C. Here, the second metal layer 20 may be formed to overlap with the second part 24. Alternatively, the second metal layer 20 is not required to overlap with the second part 24 though it is not shown. Accordingly, the upper surface of the second part 24 may be the pad part 25 or a part, which overlaps with the second part 24, of the second metal layer 20 may be the pad part 25.

The semiconductor device 300 of the present embodiment may be manufactured through the above process.

The method for manufacturing a semiconductor device of the third embodiment has the advantageous points same as those of the method of the first embodiment, and further has the following advantageous point, for example.

According to the method for manufacturing a semiconductor device of the third embodiment, a semiconductor device including the pad part 25 which can be used as an inspection pad can be manufactured.

According to the method for manufacturing a semiconductor device of the present embodiment, when the resin layer 30a is heated to be deformed, the deformation of the resin layer 30a can be controlled by the third part 23 in the step of forming the resin protrusion 18. That is, the deformation of the resin protrusion 18 can be controlled. Accordingly, a method for manufacturing a semiconductor device in which the resin protrusion 18 having a desired shape can be formed can be provided.

According to the method for manufacturing a semiconductor device of the third embodiment, such a semiconductor device can be manufactured that has high connecting reliability between an electrode and a wiring and includes the resin protrusion 18 having a controlled shape, and that an electrical characteristic thereof can be easily and safely inspected.

As understood by those skilled in the art, various changes can be made with the embodiments of the invention, which have been described in detail, without departing from the spirit and scope of the invention. Therefore, it should be noted that such changes are all included in the scope of the invention.

What is claimed is:

1. A method for manufacturing a semiconductor device, comprising:
   a) preparing a structure including a semiconductor substrate, an electrode provided on a first surface of the semiconductor substrate, and an insulation film provided on the first surface and having an opening positioned on a first part of the electrode;
   b) forming a first metal layer from an upper surface of the first part of the electrode to an upper surface of the insulation film;
   c) forming a resin layer on a first part of the first metal layer, the first part of the first metal layer being positioned on the first part of the electrode, and on the insulation film after the step b);
   d) removing at least a second part of the resin layer, the second part of the resin layer being positioned on the first part of the first metal layer, in a manner to leave a first part of the resin layer so as to form a resin protrusion;
   e) forming a second metal layer, the second metal layer being electrically connected with the electrode, from an upper surface of the first metal layer to an upper surface of the resin protrusion;
   f) forming a third metal layer on the insulation film separately from the first metal layer before the step c), wherein the resin protrusion is formed between the first metal layer and the third metal layer in the step d); and
   g) forming a fourth metal layer on the insulation film before the step c), wherein the fourth metal layer is disposed between the first metal layer and the third metal layer, and the resin protrusion is formed on the fourth metal layer in the step d).

2. The method for manufacturing a semiconductor device according to claim 1, wherein the resin protrusion is formed on a third part of the first metal layer, the third part of the first metal layer being positioned between the first part of the first metal layer and a second part of the first metal layer, in the step d).

3. The method for manufacturing a semiconductor device according to claim 1, wherein the electrode contains aluminum.

4. The method for manufacturing a semiconductor device according to claim 1, wherein the first metal layer contains titanium-tungsten.

5. The method for manufacturing a semiconductor device according to claim 1, wherein the step d) includes developing the resin layer with an alkaline developer.

6. A method for manufacturing a semiconductor device, comprising:
   a) preparing a structure including a semiconductor substrate, an electrode provided on a first surface of the semiconductor substrate, and an insulation film provided on the first surface and having an opening positioned on a first part of the electrode;
   b) forming a first metal layer from an upper surface of the first part of the electrode to an upper surface of the insulation film;
   c) forming a resin layer on a first part of the first metal layer, the first part of the first metal layer being positioned on the first part of the electrode, and on the insulation film after the step b);
   d) removing at least a second part of the resin layer, the second part of the resin layer being positioned on the first part of the first metal layer, in a manner to leave a first part of the resin layer so as to form a resin protrusion; and
   e) forming a second metal layer, the second metal layer being electrically connected with the electrode, from an upper surface of the first metal layer to an upper surface of the resin protrusion,
   wherein the resin protrusion is formed on a third part of the first metal layer, the third part of the first metal layer being positioned between the first part of the first metal layer and a second part of the first metal layer, in the step d).

7. A method for manufacturing a semiconductor device, comprising:
   a) preparing a structure including a semiconductor substrate, an electrode provided on a first surface of the semiconductor substrate, and an insulation film provided on the first surface and having an opening positioned on a first part of the electrode;

b) forming a first metal layer from an upper surface of the first part of the electrode to an upper surface of the insulation film;
c) forming a resin layer on a first part of the first metal layer, the first part of the first metal layer being positioned on the first part of the electrode, and on the insulation film after the step b);
d) removing at least a second part of the resin layer, the second part of the resin layer being positioned on the first part of the first metal layer, in a manner to leave a first part of the resin layer so as to form a resin protrusion;
e) forming a second metal layer, the second metal layer being electrically connected with the electrode, from an upper surface of the first metal layer to an upper surface of the resin protrusion; and
f) forming a third metal layer on the insulation film separately from the first metal layer before the step c),
wherein the resin protrusion is formed between the first metal layer and the third metal layer in the step d), and the resin protrusion is in contact with the third metal layer.

* * * * *